(12) United States Patent
Jaakkola et al.

(10) Patent No.: US 9,837,981 B2
(45) Date of Patent: Dec. 5, 2017

(54) TEMPERATURE COMPENSATED PLATE RESONATOR

(71) Applicant: Teknologian tutkimuskeskus VTT Oy, Espoo (FI)

(72) Inventors: Antti Jaakkola, Espoo (FI); Panu Pekko, Espoo (FI); Mika Prunnila, Espoo (FI); Tuomas Pensala, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 235 days.

(21) Appl. No.: 14/874,518

(22) Filed: Oct. 5, 2015

(65) Prior Publication Data

US 2016/0099704 A1 Apr. 7, 2016

(51) Int. Cl.
*H01L 41/09* (2006.01)
*H03H 3/04* (2006.01)
(Continued)

(52) U.S. Cl.
CPC ............. *H03H 9/17* (2013.01); *H01L 41/18* (2013.01); *H03H 9/02448* (2013.01);
(Continued)

(58) Field of Classification Search
CPC .......... H03H 3/02; H03H 3/04; G10K 11/004; F02M 61/167
USPC .................... 310/322, 346, 348; 333/187
See application file for complete search history.

(56) References Cited

U.S. PATENT DOCUMENTS

| 8,916,407 | B1 * | 12/2014 | Grosjean | B81C 1/0069 |
| | | | | 257/459 |
| 2012/0286903 | A1 * | 11/2012 | Prunnila | B81B 3/0072 |
| | | | | 333/234 |

(Continued)

FOREIGN PATENT DOCUMENTS

FI WO-2014188317 A1 * 11/2014 ............. H03H 3/007

OTHER PUBLICATIONS

Jaakkola A et al—Determination of doping and temperature-dependent elastic constants of degenerately doped silicon from MEMS resonators. IEEE Transactions on Ultrasonics, Ferroelectrics and Frequency Control, 2014, vol. 61 No. 7.

(Continued)

*Primary Examiner* — Thomas Dougherty
(74) *Attorney, Agent, or Firm* — Seppo Laine Oy (57) ABSTRACT

The invention relates to a microelectromechanical resonator device comprising a support structure and a semiconductor resonator plate doped to a doping concentration with an n-type doping agent and being capable of resonating in a width-extensional resonance mode. In addition, there is at least one anchor suspending the resonator plate to the support structure and an actuator for exciting the width-extensional resonance mode into the resonator plate. According to the invention, the resonator plate is doped to a doping concentration of $1.2*10^{20}$ cm$^{-3}$ or more and has a shape which, in combination with said doping concentration and in said width-extensional resonance mode, provides the second order temperature coefficient of frequency (TCF$_2$) to be 12 ppb/C$^2$ or less at least at one temperature. Several practical implementations are presented.

16 Claims, 7 Drawing Sheets

(51) Int. Cl.
*H03H 9/17* (2006.01)
*H01L 41/18* (2006.01)
*H03H 9/02* (2006.01)
*H03H 9/24* (2006.01)

(52) U.S. Cl.
CPC . *H03H 9/2436* (2013.01); *H03H 2009/02503* (2013.01); *H03H 2009/02527* (2013.01); *H03H 2009/2442* (2013.01)

(56) References Cited

U.S. PATENT DOCUMENTS

| 2013/0187724 | A1  | 7/2013 | Jaakkola et al. |          |
|--------------|-----|--------|-----------------|----------|
| 2014/0077898 | A1* | 3/2014 | Pensala         | H03H 3/0076 |
|              |     |        |                 | 333/187  |
| 2015/0180449 | A1* | 6/2015 | Umeda           | H03H 3/0072 |
|              |     |        |                 | 310/370  |
| 2016/0156332 | A1* | 6/2016 | Umeda           | H03H 9/174 |
|              |     |        |                 | 310/321  |

OTHER PUBLICATIONS

Shahmohammadi M. et al—Turnover temperature point in extensional-mode highly doped silicon microresonators. IEEE Transactions on Electron Devices, 2013, vol. 60 No. 3.
Shahmohammadi M. et al—Zero temperature coefficient of frequency in extensional-mode highly doped silicon microresonators. 2012 IEEE International Frequency Control Symposium (FCS) May 21-24, 2012.

* cited by examiner

TEMPERATURE COMPENSATED PLATE RESONATOR

FIELD OF THE INVENTION

The invention relates to microelectromechanical resonators. In particular, the invention relates to adjusting temperature coefficient of frequency (TCF) of plate resonators.

BACKGROUND OF THE INVENTION

Widely used quartz crystal based resonators can potentially be replaced by micromechanieal, typically silicon-based, resonators in many applications. Silicon resonators can be made smaller than quartz resonators and there are a plurality standard manufacturing methods for silicon resonators. However, a problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/C. This causes the resonance frequency to fluctuate due to changes in ambient temperature.

As concerns the TCF, both the linear, i.e. $1^{st}$ order, and $2^{nd}$ order behaviors are important in practice, since the first one represents local change of frequency on temperature change (ideally zero) and the second one, describing the curvature of the frequency vs temperature curve, represents the width of the low-drift temperature range, if the first order term is zeroed , the frequency drift comes from the second order term alone, there being a certain "turnover temperature", where the TCF achieves its absolute minimum value. The $2^{nd}$ order TCF is herein also denoted $TCF_2$ in contrast to $1^{st}$ order coefficient $TCF_1$ (linear TCF). AT-cut quartz crystals have near-zero low $TCF_1$ and $TCF_2$ at 25° C., their total, frequency drift typically being within +−10 ppm over a wide temperature range of −40° C. . . . +85° C. (so-called industrial range). The temperature performance of silicon resonators is considerably worse at the present.

One promising approach to remove or mitigate the problem of temperature drift is extremely heavy doping of silicon. The effect of homogeneous n-type doping of concentration greater than $10^{19}$ cm$^{-3}$ on bulk acoustic wave (RAW) resonator behavior has been discussed for example in WO 2012/110708, The document discusses that $TCF_1$ of a "pure" $c_{11}$-$c_{12}$ mode ($c_{11}$, $c_{12}$ and $c_{44}$ are elastic terms of the Young modulus of silicon) stays well above zero, and thus the frequency is still very dependent on temperature. However, other RAW resonance modes such as a square extensional (SE) or width extensional (WE) mode, have such dependence on elastic parameters $c_{11}$, $c_{12}$ (and $c_{44}$), that the linear TCP can be made zero by correct selection of their in-plane geometry aspect ratio.

As concerns WE mode resonators specifically, WO 2012/110708 teaches that the $1^{st}$ order TCP of a rectangular WE resonator can be zeroed using an n-dopant concentration of about $2.3*10^{19}$ cm$^{-3}$, when the ratio of side lengths of the rectangle is more than 2:1. Thus, there is a single point of temperature within these ranges at which there is no temperature drift of frequency. The document, however, does not teach how to achieve a broader stable temperature range of operation, i.e., how to minimize the $2^{nd}$ order TCP.

Another approach is to form an effective material structure with superimposed layers having different doping levels or crystal orientations, as discussed in U.S. Pat. No. 8,558,643. The structure forms a superlattice capable of carrying a resonance mode whose TCP is considerably less that of an undoped or homogeneously doped corresponding silicon element. Such structure can be also be used to decrease the $2^{nd}$ order TCP to some extent so that temperature drift of less than 50 ppm over a 100° C. range is achieved.

The abovementioned documents cite also other documents utilizing silicon doping and briefly discuss also other methods to deal with the temperature drift problem.

The temperature behavior of a resonator is not only dependent on the doping concentration, but also on its geometry, crystal orientation and resonance mode excited therein, to mention some important factors. In addition, factors that need to be taken into account are the Q-value of the resonator, in which anchoring of the resonator plays an important role, and ability to manufacture the resonator design in practice. Low TCP and high Q-value may be contradictory design objectives using known resonator designs, since they are generally achieved with different geometrical layouts, for example.

At the present, there are only few practically feasible low-TCF silicon resonator designs available, some of which are disclosed in WO 2012/110708 and U.S. Pat. No. 8,558,643, However, there is a need for new and improved practically feasible designs, which allow for better control of TCF characteristics and simultaneously high Q-value. A simple structure and manufacturing process are also desirable.

SUMMARY OF THE INVENTION

It is an aim of the invention to provide a resonator device having high stable operating frequency in varying temperatures. In particular, it is an aim to provide a resonator whose second order TCF is low in magnitude.

A further aim of the invention is to provide a resonator whose first and second order TCFs are both simultaneously low in magnitude.

The invention thus provides a microelectromechanical resonator device comprising a support structure and a semiconductor resonator plate doped to a doping concentration with an n-type doping agent and being capable of resonating in a width-extensional resonance mode. In addition, there is at least one anchor suspending the resonator plate to the support structure and an actuator for exciting the width-extensional resonance mode into the resonator plate. According to the invention, the resonator plate is doped to a doping concentration of $1.2*10^{20}$ cm$^{-3}$ or more, in particular $1.3*10^{20}$ cm$^{-3}$ or more and has a shape which, in combination with said doping concentration and in said width-extensional resonance mode, provides second order temperature coefficient of frequency ($TCF_2$) of 12 ppb C or less (in absolute value) at least at one temperature. Preferred shapes are disclosed later in this document.

Preferably, the at least one temperature referred to above comprises the room temperature (25° C.), representing roughly a middle value of the industrial temperature range (−40 . . . 85° C.), corresponding to a temperature where the vertex of the change of frequency vs. temperature curve is positioned. Second order frequency drift of 12 ppb/C$^2$ corresponds to about 50 ppm total frequency drift over the industrial range.

In particular, the $TCF_2$ can be 6 ppb/C$^2$ or less (in absolute value) and even 3 ppb/C$^2$ or less at least at one temperature, corresponding to total drifts over the industrial range of 25 ppm and 12 ppm, respectively.

More specifically, the invention is characterized by what is stated in the independent claim.

The invention provides considerable advantages. Most importantly, the invention provides passively temperature compensated resonator. At the disclosed doping concentration, one can produce a resonator whose second order TCP is zero or close to zero (i.e. below 12 ppb/C$^2$) in the width-extensional resonance mode. Thus, the resonator has high second order frequency stability at varying temperatures.

As will be described later, embodiments of the invention allow for simultaneous passive zeroing of first and second order TCFs. From a practical point of view, passive zeroing of TCF$_2$ is more crucial, because non-linear frequency vs. temperature behavior can be more difficult to compensate using e.g. active compensation circuits than the linear behavior.

The invention is realizable using n-type doping concentration provably achievable in practice. Compared with superlattice structures with different material properties in different layers stacked on top of each other, the present resonator element can be manufactured as a monolithic one-layer element, whereby its manufacturing is straightforward. Also the required dopant concentrations are smaller than that would be needed for a superlattice realization. One can also avoid complex active temperature compensation circuits around the resonator, since the resonator is inherently designed to meet the required frequency stability level.

The dependent claims are directed to selected embodiments of the invention.

In a particularly preferred embodiment, first shape and doping concentration are chosen so that the first order temperature coefficient of frequency (TCF$_1$) of the resonator device is 1 ppm/C or less at the same temperature where the TCF$_2$ is 6 ppb/C$^2$ or less (i.e. at the vertex of the TCF curve). It should be noted that although the first and second order TCFs can be zeroed separately in relatively many geometries and doping concentrations, their simultaneous passive zeroing occurs only at certain geometries and relatively narrow parameter ranges. There are no specific teachings in the literature concerning simultaneous zeroing of TCF$_1$ and TCF$_2$, this however being in the focus of this embodiment.

In one embodiment, allowing simultaneous zeroing of TCF$_1$ and TCF$_2$ the shape of the resonator plate has an aspect ratio of 1.1-1.6, in particular 1.3-1.5. Such plates have been found to be able to carry a width-extensional resonance mode having zero TCF$_1$ and zero TCF$_2$ at an n-doping concentration above the concentration threshold of 1.2*10$^{20}$ cm$^{-3}$ according to the invention. The aspect ratio is also considerably less than the ratio of 2 or more suggested by WO 2012/110708 for first order temperature compensation.

According to one embodiment, the shape of the resonator plate is rectangular. A preferred aspect ratio of a rectangular plate is 1.3.

According to one embodiment, the shape of the resonator plate is elliptical.

According to one embodiment, the resonator plate has an axis of symmetry which is aligned with the [100] direction of the semiconductor crystal with 5 degrees accuracy. Typically it is the longitudinal axis of the resonator plate (e.g. axis parallel to the longer sides of a rectangular plate for example) that is parallel with the [100] direction. High quality factors are achievable using such plates.

According to one embodiment, the resonator plate comprises a base plate, such as a rectangular or elliptical base plate, having an aspect ratio of 1.1-1.6 and there are provided one or more protrusions, such as beam protrusions, extending laterally from the base plate. The protrusions may extend at an angle with respect to the [100] direction. In one embodiment, the base plate is adapted to resonate in the width-extensional mode and the protrusions in a flexural, torsional or length-extensional mode. These embodiments are examples of more complex resonator geometries which fall within the scope of the invention.

By means of the invention, it is possible to achieve resonator devices having TCF$_1$ at or below 0.5 ppm/C and TCF$_2$ at or below 3 ppb/C$^2$.

According to one embodiment, the total temperature drift is less than 50 ppm over a 125° C. range, the range being preferably centered around 25° C. (the range thus corresponding to the common industrial range). According to a further embodiment, the total drift over that range is less than 25 ppm.

In a preferred embodiment, the resonator element comprises a monolithic silicon crystal. The doping agent can be phosphorus, antimony or arsenic, for example.

According to one embodiment, the resonator element comprises a crystal grown by Czochralski method, in which the n-type doping agent is present already in the crystal growing stage. According to another embodiment, the resonator element comprises a crystal which is epitaxially grown with the n-type doping agent present already at the growing stage. Both these methods result in a homogeneous doping of the crystal.

The silicon matrix is doped with an n-type doping agent to an average doping concentration of at least 1.2*10$^{20}$ cm$^{-3}$, which allows for not only full 1$^{st}$ order temperature compensation, but also full 2$^{nd}$ order compensation simultaneously. The doping concentration is typically higher, in particular 1.25*10$^{20}$ cm$^{-3}$ or more, to take into account that in practical designs for example actuators, such as piezoelectric actuators typically move TCF$_1$ and TCF$_2$ values towards the negative direction, whereby the silicon crystal needs to be "overdoped" (compared with theoretical estimates neglecting e.g. actuators), so that TCF$_1$ and TCF$_2$ are above zero with high enough margin.

The doping concentration may be essentially homogeneous over the resonator element, but homogeneity in particular in the depth direction of the silicon wafer is not absolutely necessary. It is however preferred that the average doping concentrations remain above the abovementioned thresholds.

The wafer used in combination with the embodiments disclosed herein is preferably a (100)-oriented single crystal silicon wafer.

It should be noted that the different portions of the resonator device are in practice acoustically coupled and therefore the width-extensional mode excited to the resonator may not be present in pure form. However, the width-extensional resonance dominates in the resonator, i.e. mostly determine its mechanical movement and TCF characteristics. In practice, there may be deviation from the ideal behavior in particular at the intersecting zones of the different parts but the present invention covers such non-ideal resonances. A skilled person is able to distinguish between different modes even if not present in pure form.

Definitions

The term "resonator plate" refers to a planar element having an aspect ratio smaller than 5, in particular smaller than 2, and being capable of resonating in the width-extensional mode, i.e., a mode where there is repeated extension and contraction of the plate along the shortest dimension of the plate. As disclosed herein, for most plate geometries the optimal aspect ratio, i.e. aspect ratio that allows for zeroing both $TCF_1$ and $TCF_2$, is less than 1.5. For example in the case of a rectangular plate, the optimal aspect ratio is 1.3 or about 1.3.

The term "aspect ratio" means the largest obtainable ratio of a first in-plane dimension of the resonator to a second in-plane dimension of the resonator perpendicular to the first in-plane dimension.

The term "TCF characteristics" means the shape of the frequency-vs-temperature curve of the resonator, and in particular the combination of $1^{st}$ order and $2^{nd}$ order change of the resonance frequency of the resonator with temperature. The term TCF characteristics, when referring to only a part of a multi-element resonator, means the TCF characteristics of a similar part, if it was rigidly fixed to an imaginary line that connects the part to other parts.

Formulated mathematically, the definition of $TCF_1$ and $TCF_2$ is obtained from a power series representation of temperature dependent frequency f of a resonator:

$$f(T)=f_0[1+TCF_1 \times \Delta T+TCF_2 \times \Delta T^2],$$

where $\Delta T=T-T_0$ is the temperature differential, $f_0$ is the frequency at the reference temperature $T_0$ (for further details see e.g. A. K. Samarao at al, "*Passive TCF compensation in high q silicon micromechanical resonators*," in IEEE International Conference on Micro Electro Mechanical Systems (MEMS 2010), Hong Kong, Jan. 2010, pp. 116-119). If not otherwise mentioned, herein $T_0=25°$ C. is used.

The term "zeroing" of $TCF_1$ and/or $TCF_2$. in the present context means reduction of $TCF_1$ and/or $TCF_2$ below a predefined level or predefined levels specified in the claims. Unless otherwise indicated or clear from the context, the $TCF_1$ and $TCF_2$ values given and terms like "decrease", "reduce" and "increase" of $TCF_1$ or $TCF_2$ refer to their absolute values, i.e. deviation from zero. It should however be noted that both $TCF_1$ and $TCF_2$ can take a negative value (undercompensation) or positive value (overcompensation).

The terms "lateral" and "in-plane" herein mean directions in the plane of the resonator, i.e., typically co-planar with the wafer the resonator device is manufactured to. Unless otherwise mentioned, the term "shape" of the resonator refers to in-plane shape of the resonator.

"Main axis" of an element means an axis of elongation and/or symmetry of an element. For example main axes of a rectangle or square are oriented in the directions of the sides of the rectangle or square and coincide with its symmetry axis. The main axis of a beam is along the elongated direction of the beam.

"Suspending" of a resonator means arranging the resonator in such a way that at least part of it is able to move with respect to the support structure in the desired resonance mode. Suspending can take place by joining a part of the resonator directly to the support structure or through one or more anchor elements, which are typically narrow bridges between the support structure and the resonator.

The term "nodal point" of a resonance mode covers, even if not explicitly mentioned, also points which as known in the art as quasinodal points.

Crystal directions are denoted with the bracket notation, e.g. [100]. By this notation any equivalent direction is meant: e.g. [100] is equivalent to [010] or [001], The present invention can be utilized in various kinds of oscillator, clock and timer units which may further form part of electronic devices, such as portable electronic devices, in particular wireless devices.

Next, selected embodiments of the invention and advantages thereof are discussed in more detail with reference to the attached drawings.

DETAILED DESCRIPTION OF EMBODIMENTS

FIG. 1 shows a rectangular resonator plate 10A having a length L and width W. The longer sides of the plate 10A are oriented along the [100] direction of the silicon crystal. Main deformation direction of the resonator plate 10A in a WE resonance mode is along the width axis of the plate and is illustrated with dashed arrows. Preferably, the deformation is symmetrical with respect to the longitudinal axis of the plate 10A.

Figure 1A:
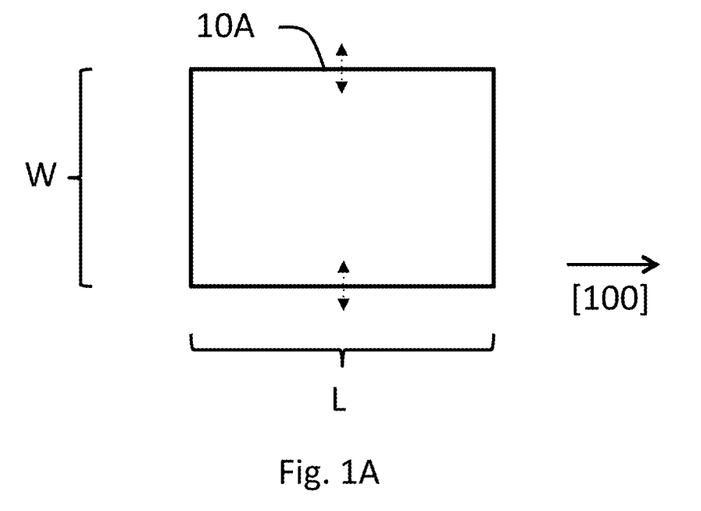
FIGS. 1A-1E show resonator geometries according to selected embodiments of the invention.
Figure 1B:
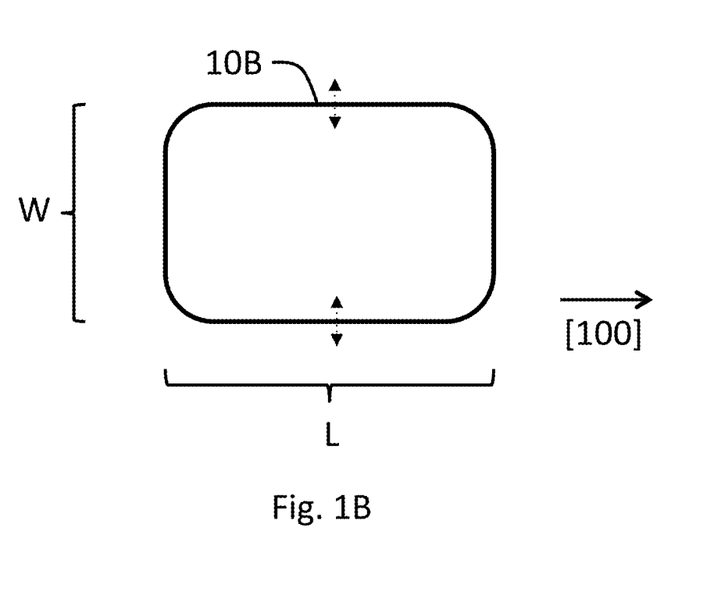

FIG. 1B shows resonator plate 10B also having a generally rectangular shape but having rounded corners. Apart from this, the resonator is similar to and also operates similarly to that of FIG. 1A.

Figure 1C:
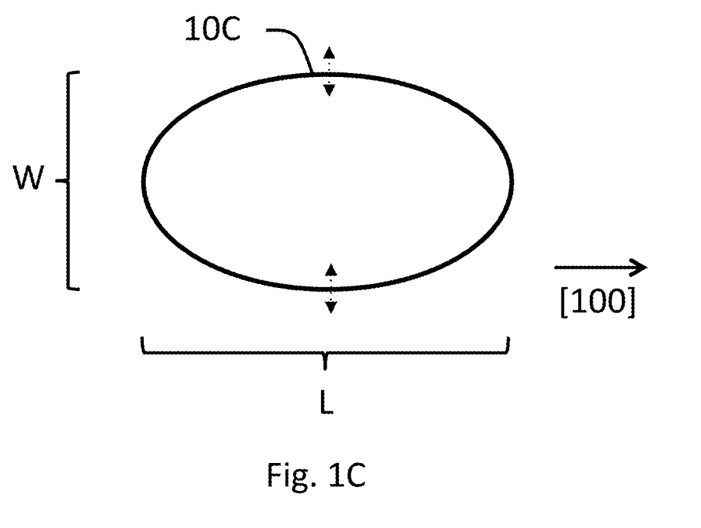

FIG. 1C shows an elliptical resonator plate 10C as another embodiment. The longer main axis of the plate has a length of L and the shorter a length of W. Optimal values and ratio of L and W may differ from those of FIGS. 1A and 1B. The elliptical plate can also resonate in a width-extensional mode, that is, along the direction of the shorter main axis.

Figure 1D:
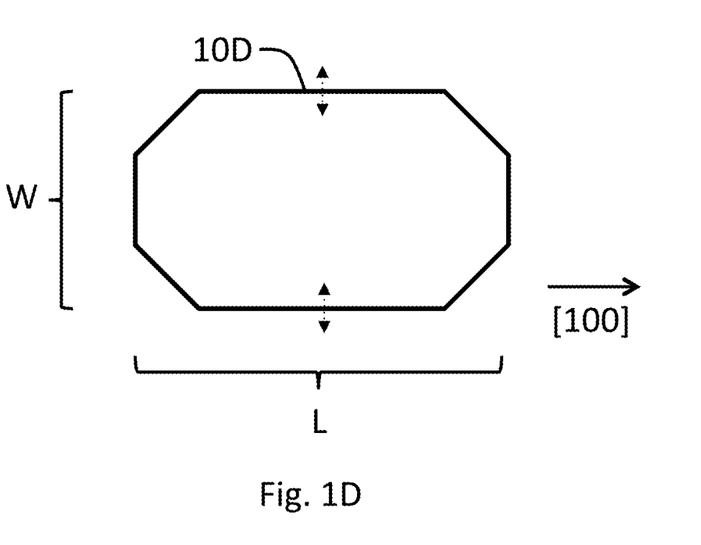

FIG. 1D shows still another embodiment of the resonator, having an octagonal resonator plate 10D.

Figure 1E:
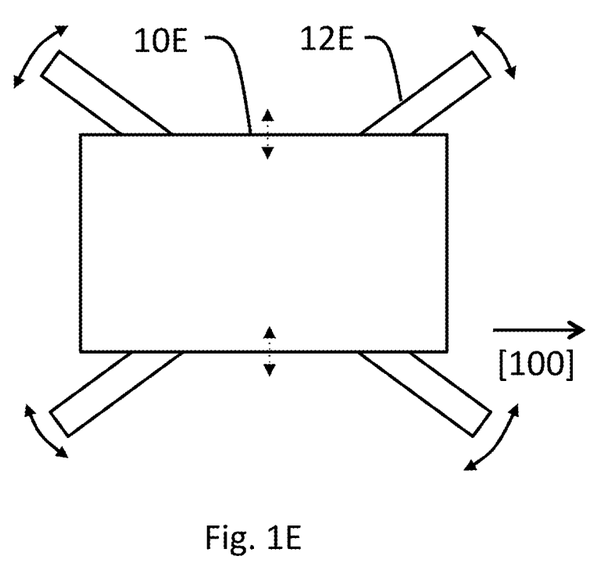

FIG. 1E shows a modified rectangular plate resonator 10E. It is provided with four protrusions 12E, which are adapted to resonate flexurally as the base plate resonates width-extensionally. The protrusions are preferably beams with an aspect ratio of 5 or more. The protrusions can be tilted with respect to the [100] crystal direction or parallel to it. In practice, the resonance mode of such compound plate is a compound mode where the WE mode dominates in the base plate and a flexural mode in the protrusions. The protrusions can be used to tune the TCF characteristics of the resonator and/or to allow for nodal anchoring of the resonator.

FIG. 1E exemplifies only one variation of basic geometries shown in FIGS. 1A-1D. Any one of the illustrated basic plate geometries, or any other base plate geometry, can be provided with one or more protrusions or other extensions in order to adjust its properties. Typically, the protrusions or extensions are dominated by another resonance mode than the base plate. The term aspect ratio herein refers to the dimensions of the base plate being dominated by the WE mode.

All the embodiments described above have a symmetry axis of the plate parallel to the [100] crystal direction. This is a preferred case, because the plate remains symmetric with respect to the silicon crystal and no parasitic resonances are created to the plate. Thus, the quality factor of the resonator remains high. However, the plate can also be rotated in the plane of the wafer by 1-45 degrees, for example, with respect to the [100] direction in order to adjust its resonance characteristics.

Anchoring of the plates 10A-10D to the supporting structure (not shown) is preferably carried using anchoring elements (not shows) spanned between the supporting structure and one or more nodal or quasinodal points of the resonance mode at the perimeter of the plate 10A-10D. In the illustrated symmetric cases, the nodal points are at the points where the axis of symmetry along the longitudinal dimension of the plates 10A-10D intersect the perimeter of the plate, i.e., for example in the middle of shorter sides of the plate IDA, 10B or 10D or at the longitudinal distal points of plate 1C.

Figure 2A:
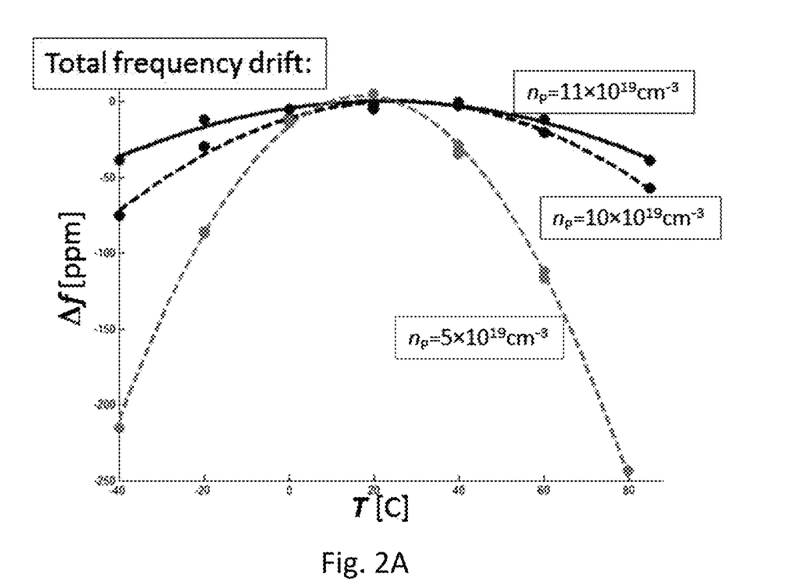
FIG. 2A illustrates a graph of total frequency drift vs. temperature for a WE mode resonator with optimized lateral aspect ratio at different doping concentrations.
Figure 2B:
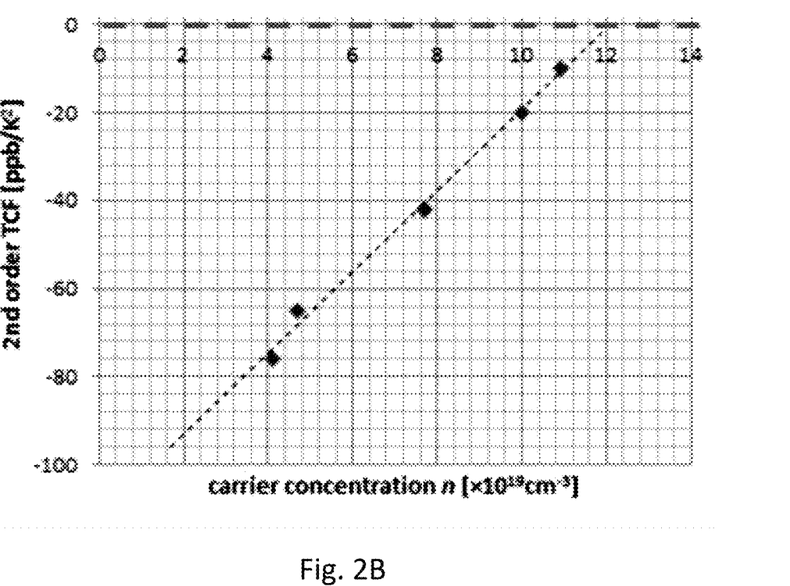
FIG. 2B shows a graph of second order TCF vs. doping concentration for a WE resonator whose linear TCF is made zero by optimal design.

FIG. 2A illustrates total frequency drift $\Delta f$ vs, temperature T measured for an optimized SE/WE mode resonator (rectangular shape with aspect ratio ranging from 1 to 1.2 and sides in the [100] direction) at three different n-doping concentrations. As can be seen the opening curvature of the frequency-vs-temperature curve (i.e. $TCF_2$) decreases with increased doping level. In more detail, the evolution of $TCF_2$ is shown in FIG. 2B. Using a linear approximation in this optimal case, it can be estimated that $TCF_2$ is zeroed at approximately $1.2*10^{20}$ cm$^{-3}$. Assuming that the second-order TCF grows monotonously when doping gets larger than $11*10^{19}$cm$^{-3}$ and that the linear TCF gets smaller simultaneously only relatively slowly, there exist a doping level and a single point (=a definite aspect ratio) on the WE-SE continuous branch, where both $TCF_1$ and $TCF_2$ are zero.

FIG. 2A shows that a total frequency drift of less than 50 ppm over the industrial range of −40 . . . +85C can be achieved with optimized geometry when the doping concentration is in the range according to the invention. Further extrapolation using the data shown in FIG. 2B on the other hand supports that a drift of less than 25 ppm is feasible.

Figure 2C:
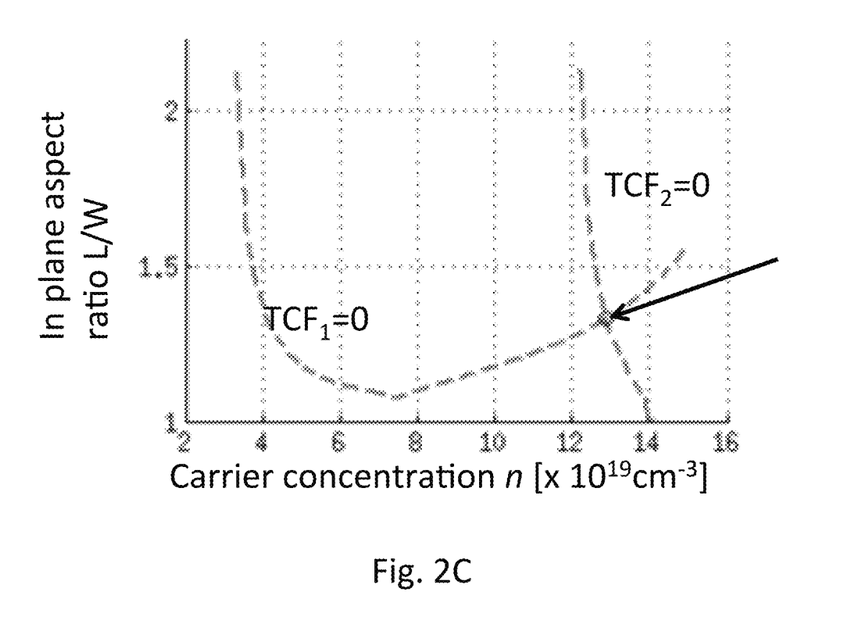
FIG. 2C shows $TCF_1=0$ and $TCF_2=0$ curves of a WE mode resonator as a function of doping concentration and in-plane aspect ratio of the base portion of the resonator.

FIG. 2C shows in detail zero $TCF_1$ and $TCF_2$ curves of a WE mode resonator (according to FIG. 1A), when n-doping concentration and aspect ratio L/W are varied. As can be seen, both $TCF_1$ and $TCF_2$ are zeroed simultaneously at about $1.3*10^{20}$ cm$^{-3}$ concentration and aspect ratio of 1.3. This qualitative result demonstrates the feasibility of the invention. FIG. 2C represents an optimal situation for a rectangular doped silicon resonator element. The simulation has been performed for a resonator with a thickness of 10 μm, width (W) of 320 μm, and whose length (L) has been varied. Simulations with thicker geometries indicate that the optimal aspect ratio is shifted to slightly lower values: when the resonator thickness is increased to 50 μm, the optimal aspect ratio is approximately 1.1. In practice, additional materials which may be present in order to provide an operational actuator, change the position of the curves to some extent. For example, a metal electrode and a piezoelectric material layer required for piezoactuation move the curves towards the right hand side and down. Consequently, the $TCF_1=TCF_2=0$ point, where the curves intersect, moves towards higher concentration and higher aspect ratio. For plate resonators in the width-extensional mode, the optimal point in practice is at a concentration of $1.2*10^{20}$ cm$^{-3}$ or higher, in particular $1.4*10^{20}$ cm$^{-3}$ or higher and the aspect ratio being 1.2-1.5.

Figure 2D:
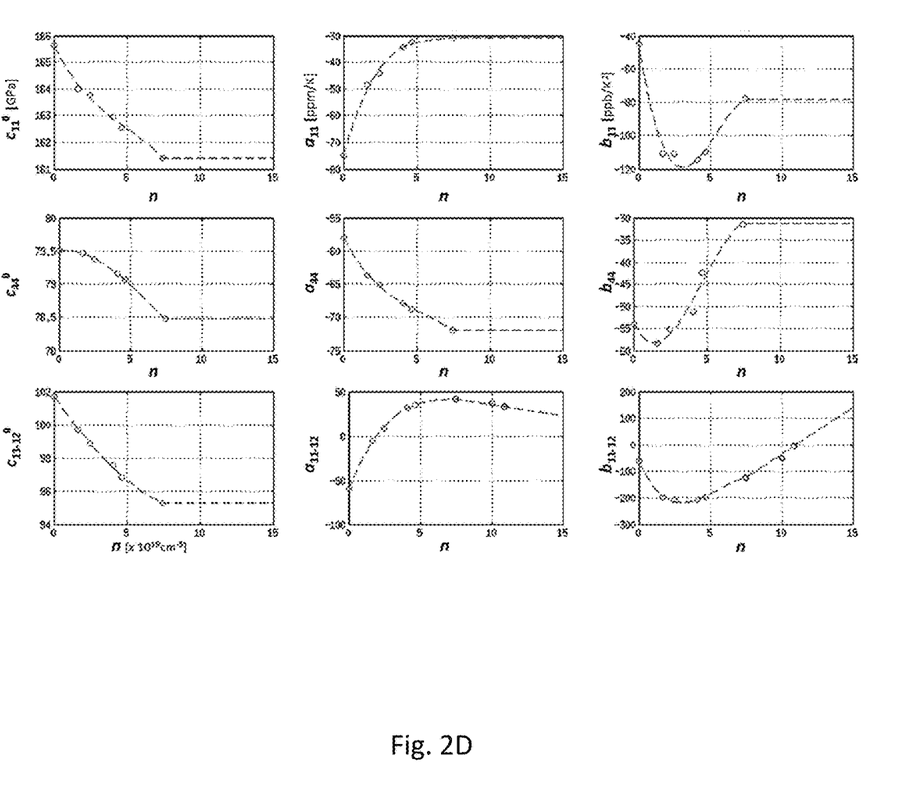
FIGS. 2D shows graphs of temperature coefficients of the elastic parameters Cy of silicon as a function of doping concentration n.

To give some further details on how the curves of FIG. 2C are generated, FIG. 2D shows temperature coefficients of the elastic parameters $c_{ij}$ as a function of carrier concentration n. The first, second and third column represent the constant terms $c^0{}_{ij}$, linear coefficients $a_{ij}$, and second-order coefficients $b_{ij}$ at T=25° C., respectively. $c^0{}_{11\text{-}12}$, $a_{11\text{-}12}$ and $b_{11\text{-}12}$ are shorthands for the coefficients of $c_{11}\text{-}c_{12}$. The dependent coefficient $a_{12}$ is readily evaluated as $a_{12}=(a_{11}c^0{}_{11}-a_{11\text{-}12}c^0{}_{11\text{-}12})/c^0{}_{12}$, and a similar equation holds for b12. Data points at carrier concentration below $7.5*10^{19}$ cm$^{-3}$ represent data from literature (Jaakkola et al, "*Determination of doping and temperature dependent elastic constants of degenerately doped silicon from MEMS resonators*," IEEE Transactions on Ultrasonics, Ferroelectrics, and Frequency Control. IEEE. Vol. 61 (2014) No: 7, 1063-1074). Data points for $1^{st}$ and $2^{nd}$ order coefficients $a_{11\text{-}12}$ and $b_{11\text{-}12}$ at carrier concentration $10*10^{19}$ cm$^{-3}$ and $11*10^{19}$ cm$^{-3}$ are shown with circles as well; these data points are based on recent measurement results of the applicant, shown in FIG. 2E, and importantly show the property of values of $b_{11\text{-}12}$ following the positive slope that starts from a dopant concentration below $5*10^{19}$ cm$^{-3}$. In calculations for producing results of FIG. 2C, the interpolated/extrapolated values represented by the dashed curves of FIG. 2D have been used.

Figure 2E:
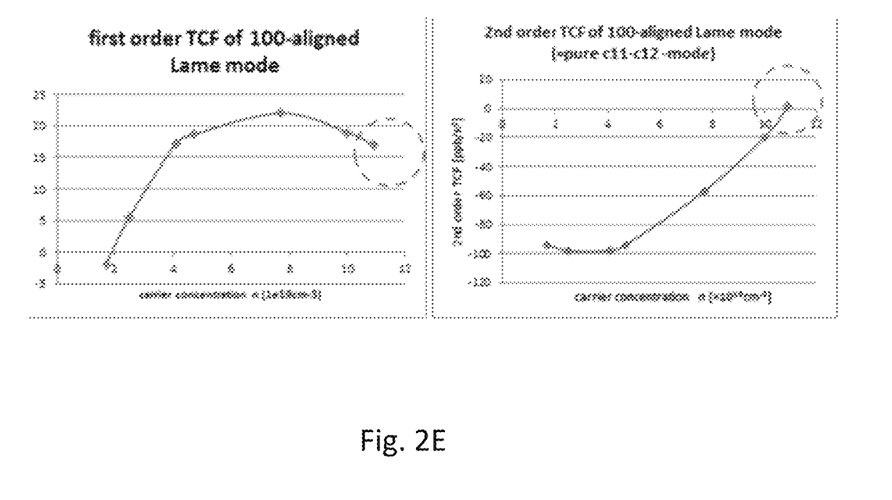
FIG. 2E shows measured first and second order TCF of a Lame mode with the plate sides in [100]-orientation as a function of carrier concentration. The two data points with the highest carrier concentration (n>=10e19cm-3) were first discovered in connection with the present invention.

The fit at carrier concentration $0<n<7.5*10^{19}$ cm-3 is based on a third order polynomial fit to the data points at carrier concentration $0<n<7.5*10^{19}$ cm-3 for all nine terms shown in the plot. The fit of $a_{11\text{-}12}$ and $b_{11\text{-}12}$ at carrier concentration $n>=7.5*10^{19}$ cm$^{-3}$ is based on a linear fit to the three data points available on this range. For other terms except $a_{11\text{-}12}$ and $b_{11\text{-}12}$ the values are assumed to stay at the same level as the experimental data at $n=7.5*10^{19}$ cm$^{-3}$. Hence, for these cases, the dashed line is horizontal for $n \leq 7.5*10^{19}$ cm$^{-3}$. Reason for this choice was that no experimental data exists for other than terms $a_{11\text{-}12}$ and $b_{11\text{-}12}$ at carrier concentrations above $7.5*10^{19}$ cm$^{-3}$. As a result, the results of FIGS. 2C-2E are not expected to be quantitatively perfectly accurate, but they do demonstrate the existence of optimal configurations where $TCF_1$ and $TCF_2$ can be zeroed simultaneously. Also, as the main terms contributing to the temperature coefficients of the resonance modes discussed in this document are $a_{11\text{-}12}$ and $b_{11\text{-}12}$, it is justified to assume that predictions of FIG. 2C hold fairly well.

FIG. 2E shows the experimental data measured for a Lame-mode resonator, which is aligned with the [100] crystalline direction so that its modal frequency is dependent solely on the elastic parameter difference term $c_{11}\text{-}c_{12}$. Data points for doping concentration $n<7.5*10^{19}$ cm$^{-3}$ are from literature (Jaakkola et al, "*Determination of doping and temperature dependent elastic constants of degenerately doped silicon from MEMS resonators*," IEEE Transactions on Ultrasonics,Ferroelectrics, and Frequency Control. IEEE. Vol. 61 (2014) No: 7, 1063-1074), but the two data points with the highest doping concentration have not previously been published. Based on the experimental data, it can be expected that the $2^{nd}$ order TCF of the [100]-aligned Lame mode resonator attains even more positive values at higher dopant levels. This has indeed been assumed in FIG. 2D, where the behavior of the $b_{11\text{-}12}$ term has been extrapolated.

It should be understood that the invention covers a large number of different resonance frequencies, doping concentrations, geometrical configurations (including shape, thickness and orientation) of the resonator, only some of which are exemplified in the drawings or in the present description. Common to them is that the resonator is capable of resonating the WE mode, has a relatively high n-doping concentration and a wide temperature-stable operating frequency range. It should be noted that is not possible to cover all possible parameter combinations in detail, but using the principles herein disclosed a skilled person is able to find a parameter combination that suits his needs.

In addition to the n-type dopant, there may be p-type dopant present in the resonator. There may for example be a homogeneous p-type background doping in the crystal.

The actuator of the present micromechanical resonator can be for example a piezoelectric actuator or electrostatic actuator, or any other actuator suitable for exciting resonance modes known per se. According to one embodiment, the actuator comprises a piezoelectric actuator positioned on top of the resonating element. The piezoelectric actuator may comprise for example an aluminum nitride (AlN) layer and a molybdenum electrode. In configurations symmetrized along a symmetry axis, two or more actuators may also be placed symmetrically with respect to that axis in order to maintain symmetry of the resonator device. Both piezoelectric and electrostatic actuators are known per se and applicable to the present resonator design by a skilled person and not discussed herein in further detail.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A microelectromechanical resonator device comprising;
    a support structure,
    a semiconductor resonator plate doped to a doping concentration with an n-type doping agent and being capable of resonating at least partly in a width-extensional resonance mode,
    at least one anchor suspending the resonator plate to the support structure, and
    an actuator for exciting said width-extensional resonance mode into the resonator plate,
    wherein the resonator plate is doped to a doping concentration of at least $1.2*10^{20}$ cm$^{-3}$ and has a shape which, in combination with said doping concentration and in said width-extensional resonance mode, provides a second order temperature coefficient of frequency (TCF$_2$) of 12 ppb/C$^2$ or less at at least one temperature.

2. The resonator device according to claim 1, wherein the shape of the resonator plate has an aspect ratio of 1.1-1.6.

3. The resonator device according to claim 1, wherein the shape of the resonator plate has an aspect ratio larger than 1.3, and the resonator plate is provided with a piezoelectric thin film forming part of said actuator.

4. The resonator device according to claim 1, wherein the shape of the resonator plate is rectangular.

5. The resonator device according to claim 1, wherein the shape of the resonator plate is elliptical.

6. The resonator device according to claim 1, wherein the shape and doping concentration of the resonator plate are such that the first order temperature coefficient of frequency (TCF$_1$) of the resonator device is 1 ppm/C or less at said at least one temperature.

7. The resonator device according to claim 1, wherein the shape of the resonator plate is non-square and non-circular and has an aspect ratio of 2 or less.

8. The resonator device according to claim 1, wherein the resonator plate has an axis of symmetry which is aligned with, a direction of the semiconductor crystals with 5 degrees accuracy.

9. The resonator device according to claim 8, wherein said axis of symmetry coincides with a longitudinal axis of the resonator plate.

10. The resonator device according to claim 1, wherein the resonator plate further comprises a base plate having an aspect ratio of 1.2-1.6 and at least one protrusion extending laterally from the base plate.

11. The resonator device according to claim 10, wherein the base plate is adapted to resonate in said width-extensional mode and the protrusions in a flexural, torsional or length-extensional mode.

12. The resonator device according to claim 1, wherein the plate resonator is doped to a doping concentration of $1.25*10^{20}$ cm$^{-3}$ or more.

13. The resonator device according to claim 1, wherein the shape and doping concentration of the resonator plate are such that the second order temperature coefficient of frequency (TCF$_2$) is 6 ppb/C$^2$ or less at said at least one temperature.

14. The resonator device according to claim 1, wherein the shape and doping concentration of the resonator plate are such that the first order temperature coefficient of frequency (TCF$_1$) of the resonator device is 0.5 ppm/C or less and the second order temperature coefficient of frequency (TCF$_2$) is 3 ppb/C$^2$ or less at said at least one temperature.

15. The resonator device according to claim 1, wherein its total temperature drift of frequency is less than 50 ppm over a temperature range spanning at least 125° C.

16. The resonator device according to claim 1, wherein said actuator further comprises a piezoelectric actuator acoustically coupled with the resonator plate.

* * * * *